(12) United States Patent
Le Royer et al.

(10) Patent No.: US 9,911,820 B2
(45) Date of Patent: Mar. 6, 2018

(54) METHOD FOR FABRICATION OF A FIELD-EFFECT WITH REDUCED STRAY CAPACITANCE

(71) Applicants: Commissariat a l'energie atomique et aux energies alternatives, Paris (FR); STMicroelectronics SA, Montrouge (FR); STMicroelectronics (Crolles 2) SAS, Crolles (FR)

(72) Inventors: Cyrille Le Royer, Tullins-Fures (FR); Frederic Boeuf, Le Versoud (FR); Laurent Grenouillet, Claix (FR); Louis Hutin, Saint Martin le Vinoux (FR); Yves Morand, Grenoble (FR)

(73) Assignees: Commissariat A L'Energie Atomique et aux Energies Alternatives, Paris (FR); STMicroelectronics SA, Montrouge (FR); STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 15/464,763

(22) Filed: Mar. 21, 2017

(65) Prior Publication Data
US 2017/0271470 A1    Sep. 21, 2017

(30) Foreign Application Priority Data

Mar. 21, 2016    (FR) ..................... 16 52403

(51) Int. Cl.
*H01L 29/06* (2006.01)
*H01L 29/49* (2006.01)
(Continued)

(52) U.S. Cl.
CPC .... *H01L 29/4983* (2013.01); *H01L 21/76895* (2013.01); *H01L 23/535* (2013.01);
(Continued)

(58) Field of Classification Search
CPC ........... H01L 29/4983; H01L 21/76895; H01L 29/66545; H01L 23/535; H01L 29/517; H01L 29/0649
See application file for complete search history.

(56) References Cited

U.S. PATENT DOCUMENTS

| 2006/0008973 A1 | 1/2006 | Phua et al. |
| 2010/0038705 A1* | 2/2010 | Doris ................ H01L 21/28026 257/327 |

(Continued)

FOREIGN PATENT DOCUMENTS

WO    WO 2009/002670 A1    12/2008

OTHER PUBLICATIONS

French Preliminary Search Report dated Nov. 24, 2016 (with Written Opinion) in French Application 16 52403 filed on Mar. 21, 2016 (with English Translation of Categories of Cited Documents).

*Primary Examiner* — Michael Carter
*Assistant Examiner* — Mohammed R Alam
(74) *Attorney, Agent, or Firm* — Oblon, McClelland, Maier & Neustadt, L.L.P.

(57) ABSTRACT

A method of fabrication, including the steps for supplying a substrate including a layer of semiconductor material covered by a sacrificial gate including a sacrificial gate insulator including a middle part, and edges covered by sacrificial spacers and having a thickness tox; removal of the sacrificial gate insulator and the sacrificial gate material; formation of a conformal deposition of thickness thk of dielectric material inside of the groove formed in order to form a gate insulator, with tox>thk≥tox/2; formation of a gate electrode within the groove; removal of the sacrificial spacers so as to open up edges of the gate insulator layer; formation of spacers on the (Continued)

edges of the gate insulator layer on either side of the gate electrode, these spacers having a dielectric constant at the most equal to 3.5.

14 Claims, 7 Drawing Sheets

(51) Int. Cl.
  *H01L 29/51* (2006.01)
  *H01L 23/535* (2006.01)
  *H01L 29/66* (2006.01)
  *H01L 21/768* (2006.01)
(52) U.S. Cl.
  CPC ........ *H01L 29/0649* (2013.01); *H01L 29/517* (2013.01); *H01L 29/6653* (2013.01); *H01L 29/66545* (2013.01); *H01L 29/66606* (2013.01); *H01L 29/66628* (2013.01)

(56) References Cited

U.S. PATENT DOCUMENTS

| | | | |
|---|---|---|---|
| 2012/0043623 A1* | 2/2012 | Doris | H01L 21/28114 257/410 |
| 2013/0082311 A1* | 4/2013 | Cheng | H01L 29/7834 257/288 |
| 2014/0110798 A1 | 4/2014 | Cai et al. | |
| 2015/0108590 A1 | 4/2015 | Alptekin et al. | |
| 2015/0111350 A1 | 4/2015 | Alptekin et al. | |
| 2015/0255561 A1 | 9/2015 | Cai et al. | |
| 2015/0263128 A1 | 9/2015 | Basker et al. | |
| 2016/0233337 A1 | 8/2016 | Basker et al. | |

* cited by examiner

METHOD FOR FABRICATION OF A FIELD-EFFECT WITH REDUCED STRAY CAPACITANCE

The invention relates to the methods of fabrication of field-effect transistors, in particular field-effect transistors for technological nodes of small dimensions, with reduced stray capacitances.

In the fabrication of a field-effect transistor, it is generally sought to reduce the switching power consumption and the switching time. These parameters are notably very strongly affected by the stray capacitances between the gate, on the one hand, and the contacts for the source and the drain of the transistor, on the other hand.

The stray capacitances tend to become particularly significant for field-effect transistors of very small dimensions, typically for gate lengths of less than around fifty nanometers, and in particular less than 20 nm. Indeed, the shorter the gate length, the more the distances between the gate, on the one hand, and the contacts for the source and of the drain, on the other hand, get reduced.

Fabrication methods known as sacrificial-gate processes avoid deteriorating the gate metal and the gate insulator during annealing steps for activation of the dopants implanted in the source and the drain. In such a method of fabrication, a sacrificial gate is deposited prior to the formation of the source and of the drain, then is removed in order to be replaced by a gate stack, including a high-permittivity gate insulator referred to as Hk (or High K), and a gate electrode material. Field-effect transistors fabricated according to such fabrication methods do however exhibit greatly enhanced stray capacitances between the gate and the contacts.

The document WO2009/002670 describes a method for fabrication of a field-effect transistor. This method of fabrication is of the sacrificial-gate type. In the method of fabrication described in this document, the sacrificial gate comprises a first gate dielectric in contact with the substrate. The first gate dielectric is covered by a sacrificial gate material in its middle part and by sacrificial spacers on its edges. The method comprises the etching of the sacrificial gate material and of the middle part of the first gate dielectric, in such a manner as to form an access to the substrate in the shape of a groove. A layer of Hk dielectric is deposited on the various walls of the groove. A gate metal is subsequently deposited on this layer of Hk dielectric, in such a manner as to fill the grooves. The sacrificial spacers are subsequently removed until the edges of the first gate dielectric are uncovered. The major part of the layer of Hk dielectric is removed from the lateral faces of the gate metal, so as to conserve the Hk dielectric as second gate dielectric under the gate metal and in extensions as far as the first gate dielectric. The second gate dielectric then has a thickness less than that of the first gate dielectric. The method subsequently comprises the formation of spacers of the low-permittivity Lk (or Low k) type on either side of the gate metal, both on the first gate dielectric and on the extensions of the second gate dielectric. The spacers of the Lk type thus allow the stray capacitance between the gate and the source and drain contacts to be reduced.

Such a method of fabrication is not optimal for large-scale production and may lead to dispersions in the transistors formed. The invention aims to solve one or more of these drawbacks. There notably exists a need for a novel method of fabrication allowing spacers made of Lk materials to be formed on a gate insulator of Hk material. The invention thus relates to a method for fabrication of a field-effect transistor, such as defined in the appended claims.

Other features and advantages of the invention will become more clearly apparent from the description that follows hereinafter, by way of non-limiting example, with reference to the appended drawings, in which.

Figure 1:
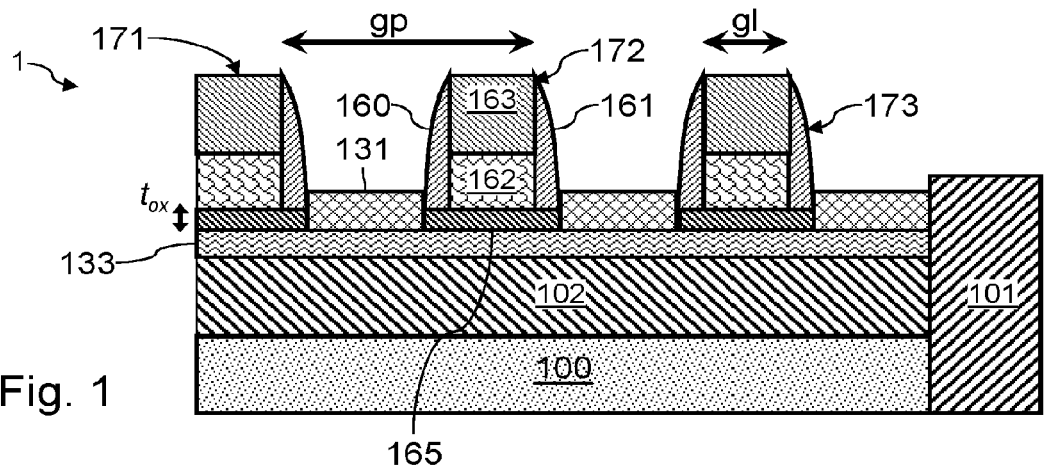
FIGS. 1 to 13 are transverse cross-sectional views of an integrated circuit at various steps of one example of a method of fabrication according to one embodiment of the invention.

FIG. 1 is a cross-sectional view of an integrated circuit 1 during one example of a method of fabrication according to one embodiment of the invention. The integrated circuit 1 supplied, at this stage, comprises field-effect transistors 171 to 173 in the process of formation. The integrated circuit 1 comprises, in a manner known per se, a substrate semiconductor 100. The substrate 100 here is of the SOI type and is therefore covered by a layer of buried insulator 102.

The layer of buried insulator 102 is covered by a layer of semiconductor 133 material usually denoted by the term 'active layer'. The layer of semiconductor material 133 is notably configured so as to allow the formation of a channel under the respective gate of each transistor in the process of formation. The layer 133 is typically formed from silicon or from a semiconductor containing silicon or from a semiconductor of the III-V type. For a transistor 1 of the FDSOI type, the layer 133 has a doping typically less than $5*10^{15}$ cm$^{-3}$ under sacrificial gates and typically of the order of $10^{15}$ cm$^{-3}$. The layer 133 has for example a thickness in the range between 3 and 15 nm. A deep trench isolation 101 (with a structure known per se) is formed here on the side of the transistors 171 to 173, and passes through the layer of semiconductor material 133 and the layer of buried insulator 102 until it reaches the substrate 100. The trench isolation 101 may comprise $SiO_2$, in a manner known per se.

For each of the field-effect transistors 171 to 173 in the process of formation, the integrated circuit 1 comprises dummy or sacrificial gates. Each sacrificial gate here comprises a sacrificial gate insulator 165. The sacrificial gate insulator 165 is for example formed from $SiO_2$. The sacrificial gate insulator 165 has a thickness denoted by the parameter tox. The thickness tox is for example advantageously in the range between 2 and 5 nm. The sacrificial gate insulator 165 is covered in its middle part by a sacrificial gate material 162, the sacrificial gate material 162 being covered by a sacrificial plug 163. The sacrificial gate material 162 is for example formed from polysilicon. The sacrificial plug 163 is for example formed from SiN. The edges of the sacrificial gate insulator 165 are covered by sacrificial spacers 160 and 161, positioned on either side of the sacrificial gate material 162 and of the sacrificial plug 163. The sacrificial spacers 160 and 161 are for example formed from SiN or from $SiO_2$. The parameters gp and gl illustrated here respectively correspond to the gate pitch and to the gate length of the transistors 171 to 173 to be formed. The values of gp and gl are for example respectively 64 nm and 20 nm for a technological node at 14 nm.

Each of the transistors 171 to 173 in the process of formation comprises a source and a drain positioned on either side of its sacrificial gate. In the embodiment illustrated here, between two adjacent sacrificial gates, an element made of semiconductor material 131 is arranged in a raised position with respect to the layer of semiconductor material 133. Here, each raised element made of semiconductor material 131 is intended to form a common conduction electrode (source or drain) for the two transistors in the process of formation between which it is arranged. Each element 131 may be formed in a manner known per se by an epitaxial growth of silicon. Each element 131 may for example have a thickness in the range between 10 and 40 nm.

Figure 2:
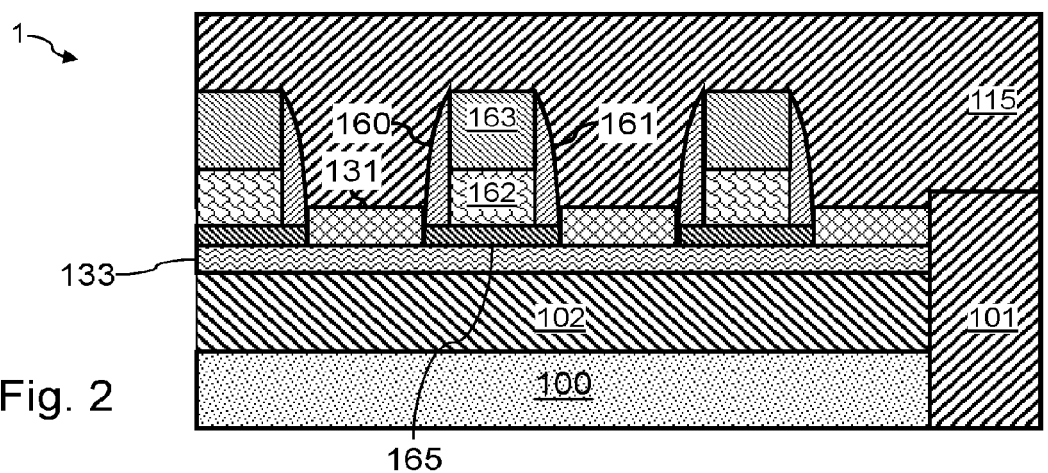

At the step illustrated in FIG. 2, the deposition of a filler dielectric 115 has been carried out so as to cover the sacrificial gates and the elements 131. The dielectric 115 is for example composed of $SiO_2$.

Figure 3:
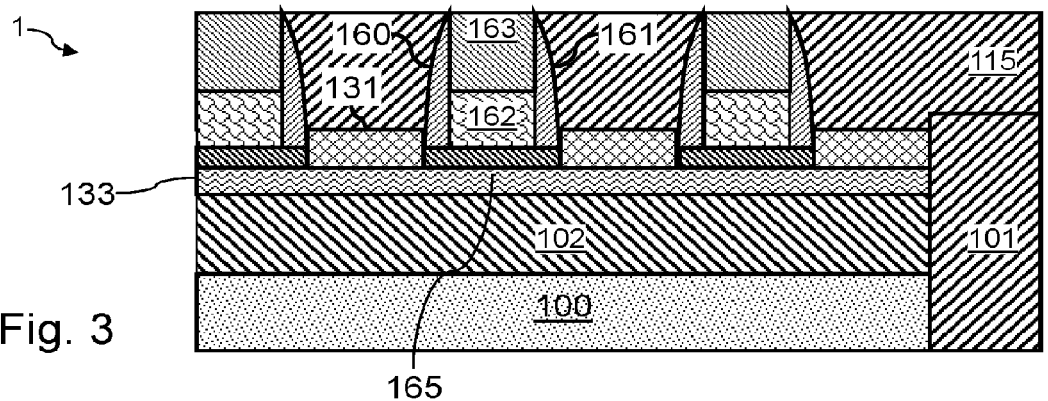

At the step illustrated in FIG. 3, a step for chemical-mechanical polishing of the dielectric 115 is carried out with a stop on the sacrificial plug 163. The filler dielectric 115 is thus conserved between the sacrificial gates over the raised elements 131.

Figure 4:
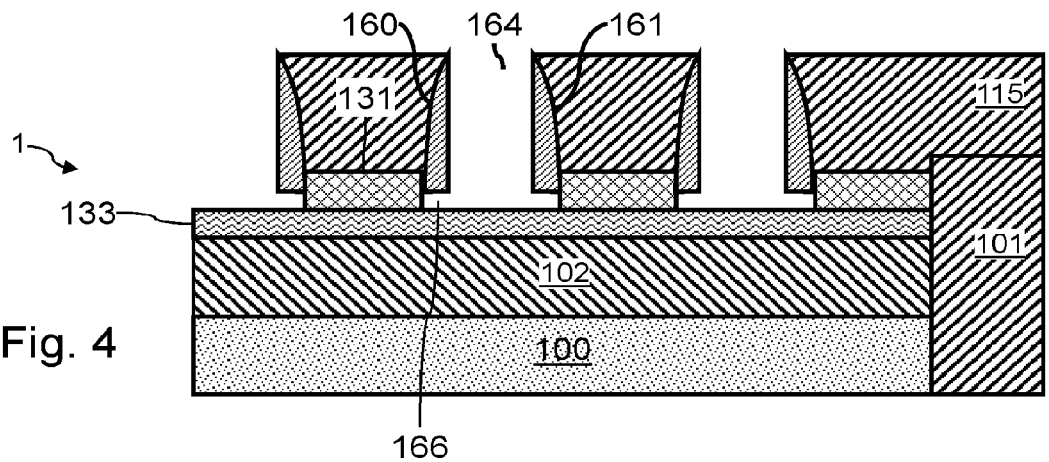

At the step illustrated in FIG. 4, the sacrificial plug 163, the sacrificial gate material 162, and the sacrificial gate insulator 165 are removed according to etching technologies known per se. A groove 164 is thus created between each pair of sacrificial spacers 160, 161. Cavities 166 having a thickness tox are also created under the spacers 160 and 161, owing to the removal of the sacrificial gate insulator 165.

Figure 5:
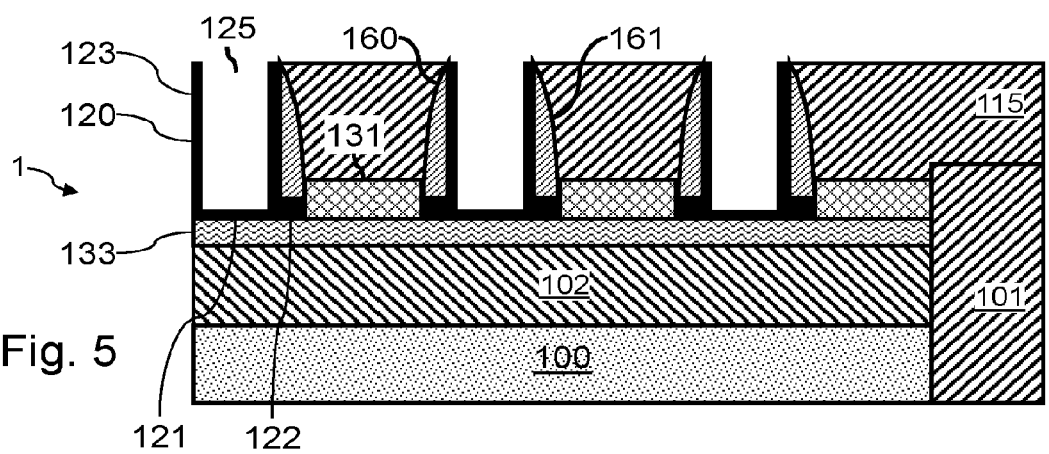

At the step illustrated in FIG. 5, a conformal deposition of a layer 120 of a dielectric of the Hk type is carried out. The conformal deposition of the layer 120 may for example be carried out by a process of the ALD type. The conformal deposition of the layer 120 is advantageously carried out over a thickness verifying the following relationship:

$$thk \geq tox/2$$

With such a parameter, it is guaranteed that the layer 120 really does form a complete filling 122 of the cavities 166 under the sacrificial spacers 160 and 161. The creation of air pockets within the layer 120 inside of the cavities 166 is thus avoided. The layer 120 comprises a bottom wall 121 covering the layer 133 in the bottom of the grooves 164, and comprises side walls 123 covering the internal lateral faces of the spacers 160 and 161. After the deposition of the layer 120, grooves 125 remain existing between the sacrificial spacers 160 and 161.

In the following, it will be considered that a high-permittivity dielectric or Hk dielectric is a dielectric which has a dielectric constant equal to at least 4. The dielectric constant of the layer 120 will be advantageously equal to at least 7. The layer of dielectric 120 could for example be formed from $TiO_2$, $Al_2O_3$, $ZrO_2$, $HfO_2$, $Ta_2O_5$, or $La_2O_3$, or from nitrides of these materials. The layer 120 is formed from a material which can be etched selectively with respect to the sacrificial spacers 160 and 161.

Figure 6:
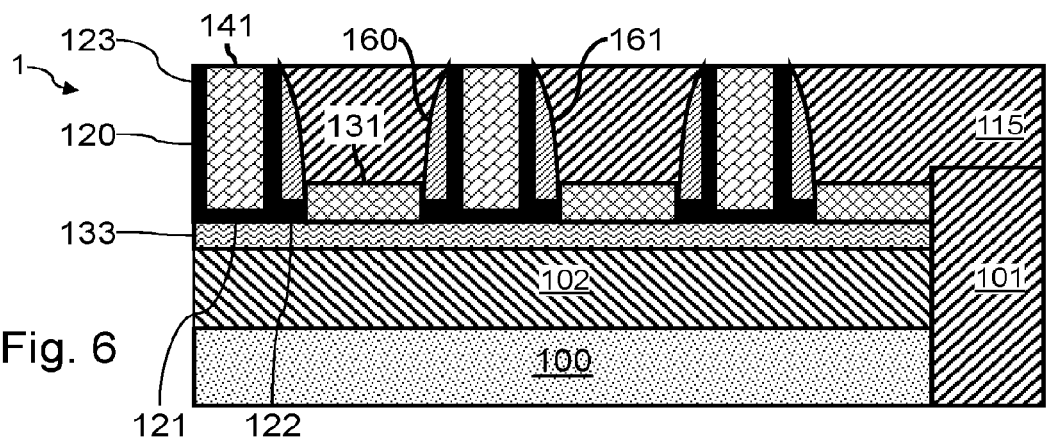

In FIG. 6, a metallization has been carried out in such a manner as to fill the grooves 125. The metallization may comprise a metal deposition of a gate metal 141 known per se. Alternatively, the grooves 125 may also be filled with doped polysilicon. A step for chemical-mechanical polishing of the gate metal 141 is subsequently carried out with a stop on the filler dielectric 115.

Figure 7:
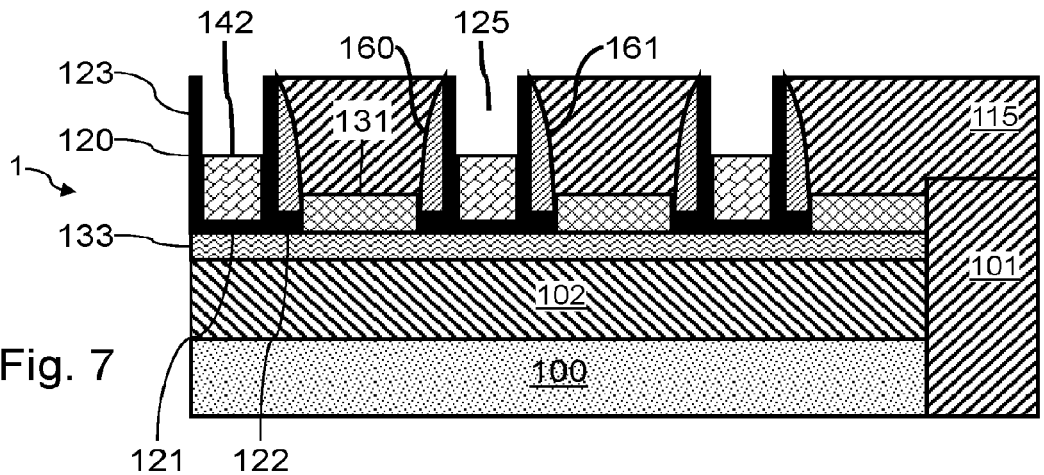

In FIG. 7, partial removal of the gate metal between the sacrificial spacers 160 and 161 has been carried out. The partial removal is for example carried out over a depth in the range between 5 and 20 nm. Such a partial removal may be carried out according to a process known per se to those skilled in the art. Gate metal is conserved in the grooves 125 in order to form the gate electrodes 142 on the walls 121 of the layers 120.

Figure 8:
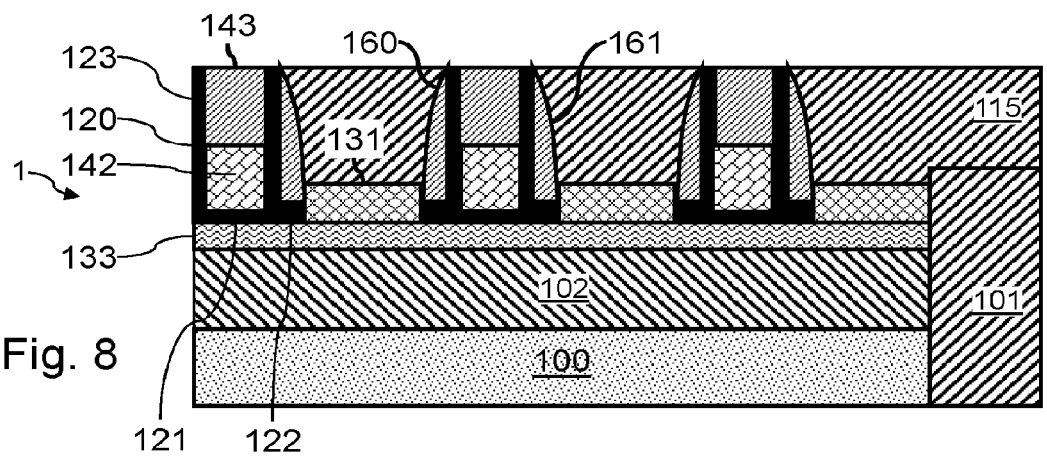

In FIG. 8, the formation of plugs 143 of dielectric on the gate electrodes 142 has been carried out in a manner known per se. The plugs 143 are for example formed from SiN. The plugs 143 may also be formed from other dielectric materials whose etching is selective with respect to the filler dielectric 115, or with respect to the material of the sacrificial spacers 160 and 161.

Figure 9:
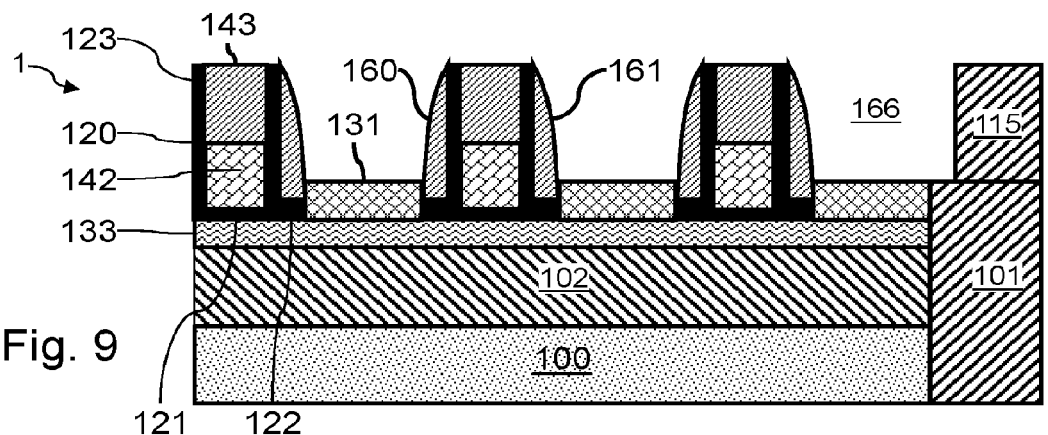

In FIG. 9, steps for photolithography and for etching of the filler dielectric 115 have been carried out. The filler dielectric 115 is etched until accesses 166 are formed opening up both the external lateral faces of the sacrificial spacers 160 and 161 and the upper face of the raised elements made of semiconductor material 131.

Figure 10:
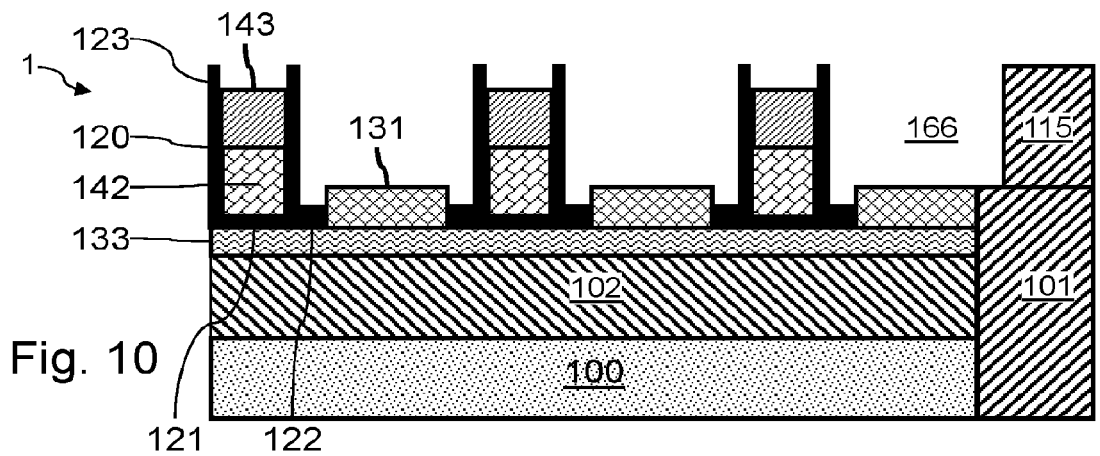

In FIG. 10, the removal of the sacrificial spacers 160 and 161 has been carried out. The side walls 123 and the fillers 122 of the layer 120 have thus been opened up.

Figure 11:
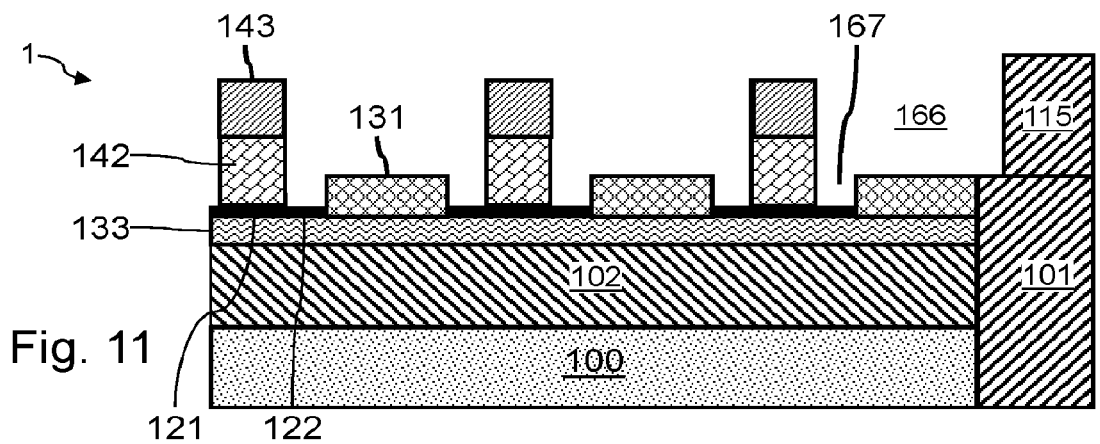

In FIG. 11, the side walls 123 have been removed from the layer 120. The side walls of the gate electrodes 142 and of the plugs 143 have thus been opened up. Furthermore, the upper part of the fillers 122 is also partially removed. Accesses 167 to the upper part of the fillers 122 have thus been created. For a layer 120 of hafnium silicate, an etching of the HF type allows the side walls 123 to be removed without damaging the gate electrodes 142. For a layer 120 of $HfO_2$, an isotropic dry etching using $BCl_3$ may be carried out, or an implantation with tilt into the layer 120 may be carried out, prior to performing a dry or wet etching.

Defining RH=tox/thk, if a thickness tre (tre≥thk) of the layer 120 is removed, the filler 122 conserves a thickness tfi defined by the following relation:

$$Tfi = tox - tre = RH*thk - tre$$

If $thk = tre, tfi = (RH-1)*tre$

With thk≥tox/2, RH≤2, and therefore tfi≤thk

In order not to remove the whole of the filler 122 when the side walls 123 are removed, tox>thk.

Figure 12:
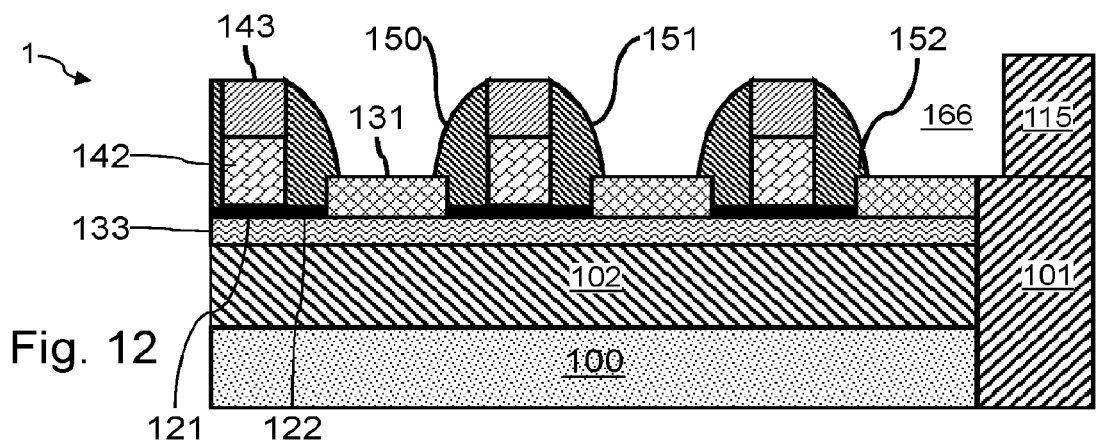

In FIG. 12, the formation of the spacers 150 and 151 has been carried out on either side of each stacking of a gate electrode 142 and of a plug 143. The spacers 150 and 151 are made of a material of the Lk type, in other words their dielectric constant is, at the most, equal to 3.5, preferably, at the most, equal to 3. Advantageously, if the ratio between the dielectric constant of the layer 120 and the dielectric constant of the spacers 150 and 151 is defined by Rk, Rk is advantageously equal to at least 2 and, preferably, equal to at least 5. Thus, both the performance of the gate insulator as far as under the spacers can be optimized, and the stray capacitances between the gate and source or drain contacts can be limited. The spacers 150 and 151 could for example be formed from an organo-silicate, including atoms of Si, C, O or H.

It is observed that the gate insulator formed by the layer 120 runs between two adjacent elements made of semiconductor material 131, which allows a gate insulator of the Hk type to be obtained over a maximum surface area of the semiconductor layer 133.

In the example illustrated, the spacers 150 and 151 cover the upper face of the fillers 122 and block the accesses 167 in order to provide an optimum protection of the fillers 122 with respect to a source or drain contact. Advantageously, according to the example illustrated, the spacers 150 and 151 comprise extensions 152 overhanging a respective raised element 131. Thus, the protection of the fillers 122 is further improved with respect to a source or drain contact. The extensions 152 could for example extend laterally over a length in the range between 3 and 5 nm in order to guarantee an overhang of a raised element 131 despite dispersions in fabrication methods.

Figure 13:
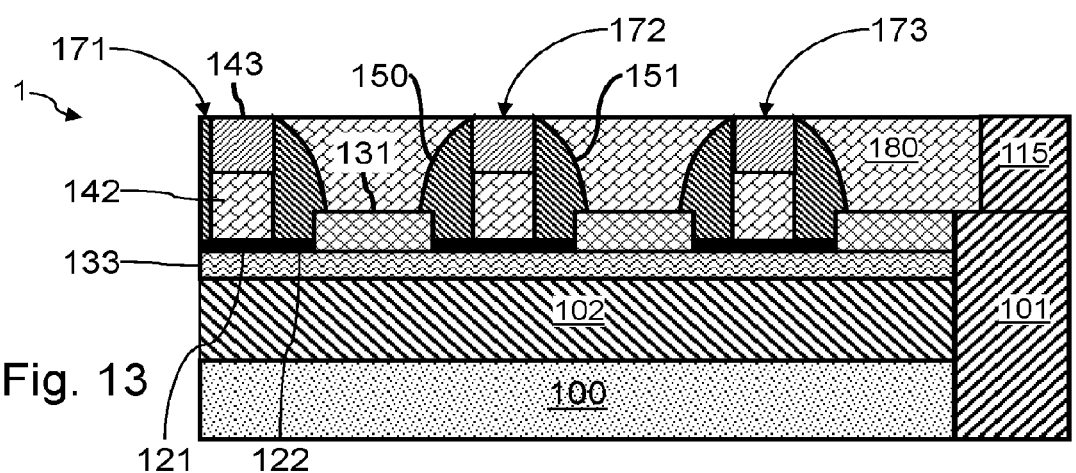

In FIG. 13, a metallization has been carried out in order to fill the accesses 166 until in contact with the raised elements 131. The metallization may for example comprise a step for metal deposition of a material chosen from within the group composed of: Cu, Co, W, Al, Ti. A step for chemical-mechanical polishing of the metal deposition has subsequently been carried out with a stop on the plugs 143.

Contacts 180 have thus been formed on the raised elements 131. The contacts 180 are thus electrically connected to the sources and drains of the transistors 171 to 173. These contacts 180 are self-aligned with the stacks of the gates of the various transistors 171 to 173, since they extend until in line with the spacers 150 and 151.

It may, as a prior step, be envisaged to perform steps for silicidation of the raised elements made of semiconductor material 131, or for deposition of a thin layer of dielectric on these elements 131, in order to reduce the contact resistance with the source or drain contacts 180.

In the example illustrated, the Lk spacers 150 and 151 comprise extensions 152 over the elements 131. There may also be an absence of overhang of the spacers 150 and 151 over the elements 131.

In the example illustrated, the adjacent transistors share a common connection electrode, and a common contact for this electrode. Adjacent transistors having dissociated conduction electrodes may of course be used.

Figure 14:
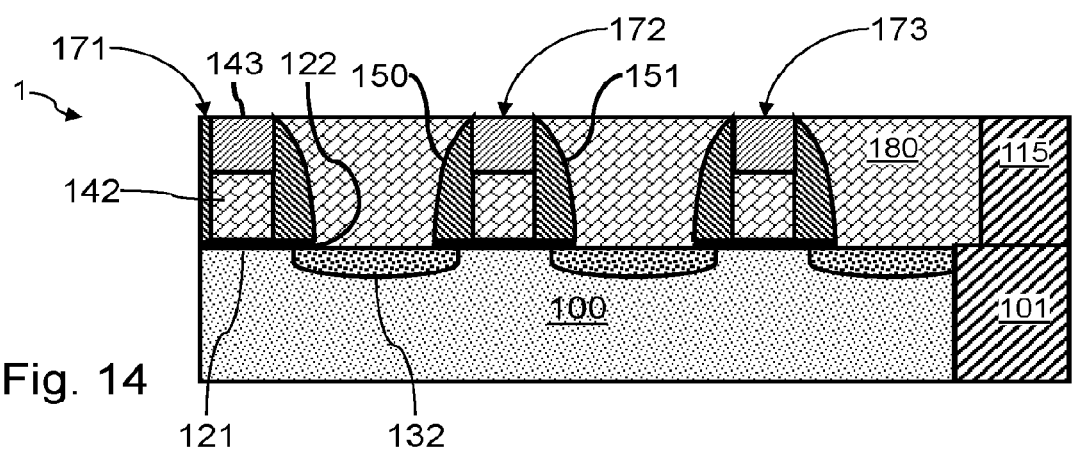
FIGS. 14 to 21 are transverse cross-sectional views of an integrated circuit fabricated according to one variant of a method of fabrication of the invention, applied to a substrate of the bulk type.

The embodiment detailed beforehand was applicable to an integrated circuit 1 of the SOI type, comprising sources and drains raised up by a deposition onto a layer of semiconductor 133 in order to form the channel of the transistors. The invention is of course applicable to an integrated circuit 1 comprising a bulk substrate 100, as illustrated in FIG. 14.

Figure 15:
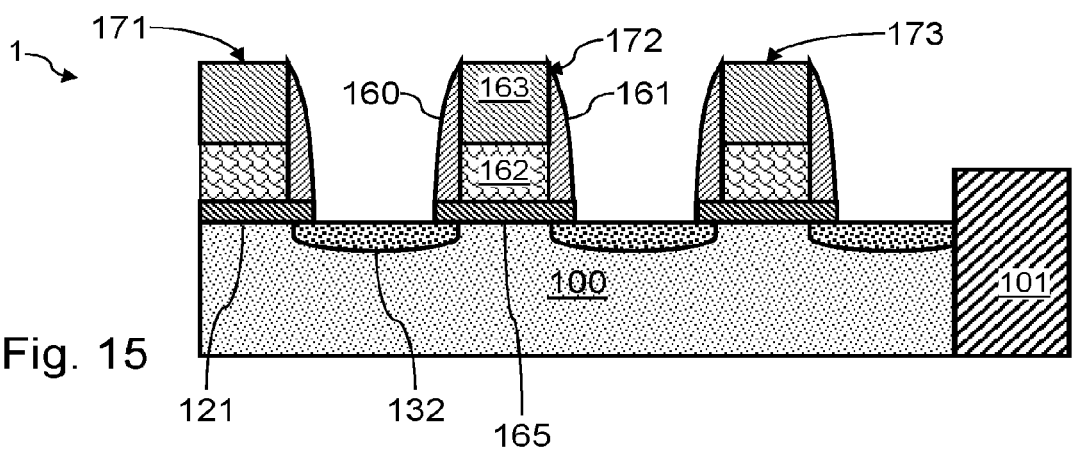

FIG. 15 is a cross-sectional view of the integrated circuit 1 comprising a bulk substrate 100, during one example of a method of fabrication according to another embodiment of the invention. The integrated circuit supplied at this stage comprises field-effect transistors 171 to 173 in the process of formation. The bulk substrate 100 has a structure known per se to those skilled in the art. The substrate 100 is for example formed from silicon not intentionally doped. Within its upper part, the bulk substrate 100 comprises regions 132 having an increased concentration of dopant, in a manner known per se to those skilled in the art. The regions 132 are each destined to form a source and/or a drain for the transistors.

For each of the field-effect transistors 171 to 173 in the process of formation, the integrated circuit 1 comprises dummy or sacrificial gates. Each sacrificial gate can have the same structure and/or composition as in the preceding embodiment. Each sacrificial gate here comprises a sacrificial gate insulator 165. The sacrificial gate insulator 165 has a thickness tox. The sacrificial gate insulator 165 is covered in its middle part by a sacrificial gate material 162, the sacrificial gate material 162 being covered by a sacrificial plug 163. The edges of the sacrificial gate insulator 165 are covered by sacrificial spacers 160 and 161, positioned on either side of the sacrificial gate material 162 and of the sacrificial plug 163. The edges of the sacrificial gate insulator 165 overhang adjacent edges of the regions 132. Each sacrificial gate thus comprises, on either side, a source and a drain formed within regions 132. The middle part of the sacrificial gate insulator 165 overhangs a channel region of the substrate 100.

Figure 16:
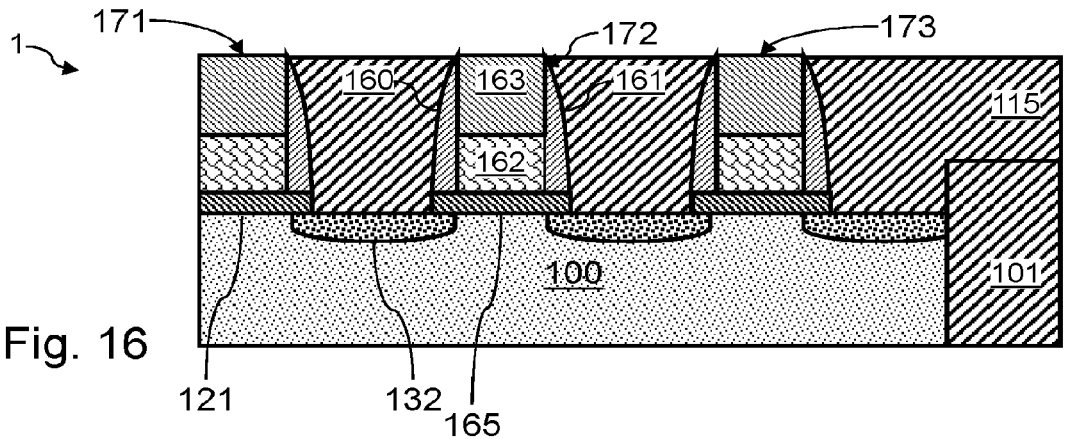

At the step illustrated in FIG. 16, the deposition of a filler dielectric 115 is carried out so as to cover the sacrificial gates and the regions 132 (at least their middle part). The dielectric 115 is for example composed of $SiO_2$. A step for chemical-mechanical polishing of the dielectric 115 has subsequently been carried out with a stop on the sacrificial plug 163. The filler dielectric 115 is thus conserved between the sacrificial gates, on the regions 132.

Figure 17:
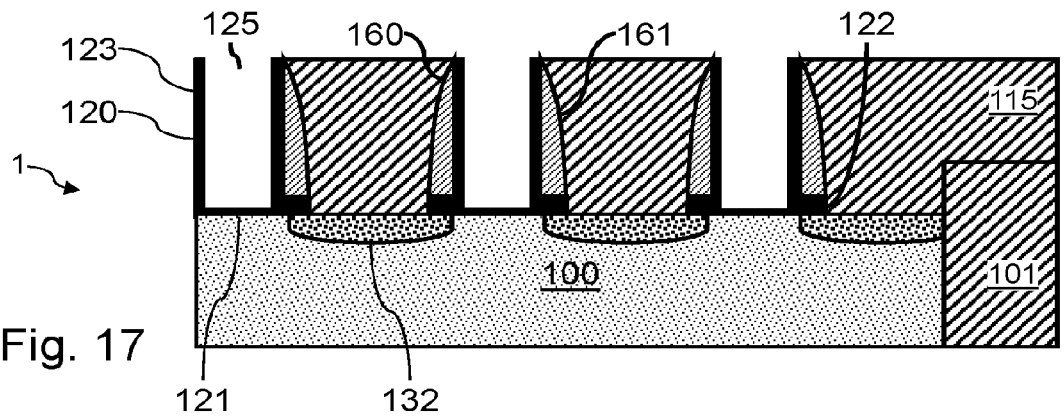

At the step illustrated in FIG. 17, the sacrificial plug 163, the sacrificial gate material 162, and the sacrificial gate insulator 165 for each sacrificial gate have been removed, according to etch technologies known per se. After having thus created a groove between each pair of sacrificial spacers 160, 161, and created cavities of thickness tox under the spacers 160 and 161, a conformal deposition of a layer 120 of a dielectric of the Hk type has been carried out. The conformal deposition of the layer 120 may for example be carried out by a process of the ALD type. The deposition of the layer 120 is typically performed with the same parameters as those described in the preceding embodiment. The layer 120 can have the same composition as in the preceding embodiment.

The layer 120 thus forms a layer 122 completely filling the cavities under the sacrificial spacers 160 and 161. The layer 120 comprises a bottom wall 121 covering the upper face of the substrate 100 in the bottom of the grooves between the sacrificial spacers 160 and 161. The layer 120 also comprises side walls 123 covering the internal lateral faces of the spacers 160 and 161. After the deposition of the layer 120, grooves 125 remain created between the sacrificial spacers 160 and 161.

Figure 18:
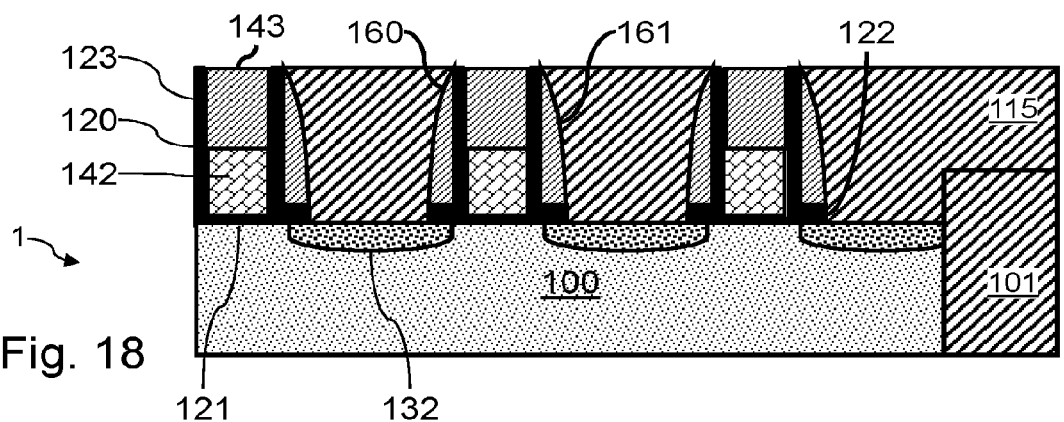

In FIG. 18, a metallization has been carried out in such a manner as to fill the grooves 125, for example by metal deposition of a gate metal. A step for chemical-mechanical polishing of this gate metal has subsequently been carried out with a stop on the filler dielectric 115. A partial removal of the gate metal between the sacrificial spacers 160 and 161 has subsequently been carried out. The partial removal of the gate metal is for example applied over a depth in the range between 5 and 20 nm. The gate metal conserved in the grooves 125 forms gate electrodes 142 on the walls 121 of the layers 120. In a manner known per se, the formation of plugs 143 of dielectric on the gate electrodes 142 has subsequently been carried out. The plugs 143 can have the same composition as in the preceding embodiment.

Figure 19:
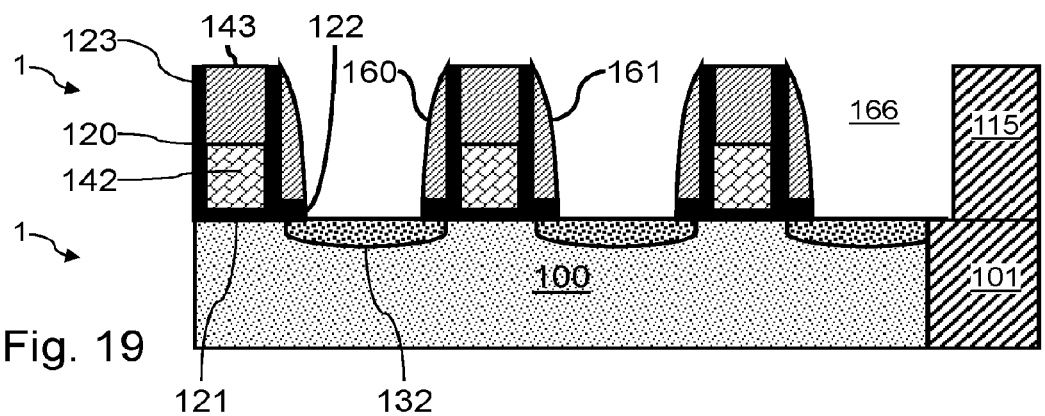

In FIG. 19, steps for photolithography and for etching of the filler dielectric 115 have been carried out. The filler dielectric 115 is etched until accesses 166 are formed opening up both the external lateral faces of the sacrificial spacers 160 and 161, and the upper face of the regions 132, at least in their middle part.

Figure 20:
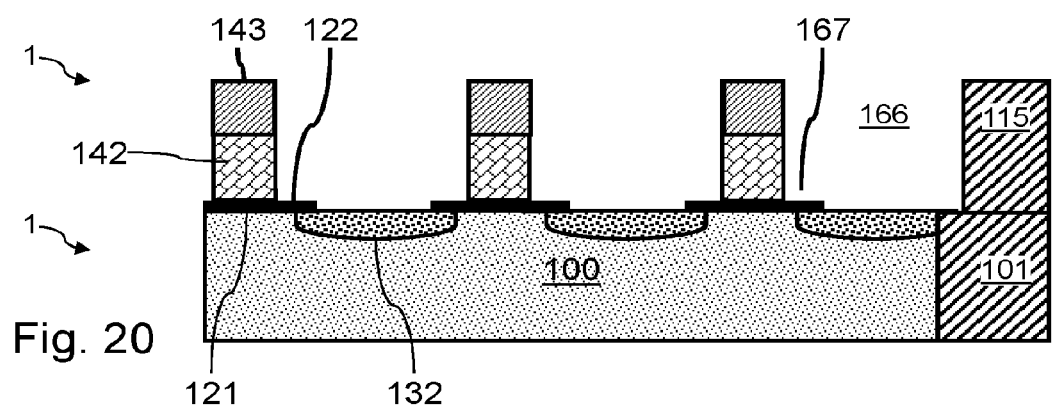

In FIG. 20, the removal of the sacrificial spacers 160 and 161 has been carried out. Thus, the side walls and the fillers 122 of the layer 120 have initially been uncovered. The side walls 123 of the layer 120 have subsequently been removed. The side walls of the gate electrodes 142 and of the plugs 143 have thus been opened up. Furthermore, the upper part of fillers 122 is also partially removed. Accesses 167 to the upper part of the fillers 122 have thus been created. The etching processes and parameters for the layer 120 described in the preceding embodiment may be used.

Figure 21:
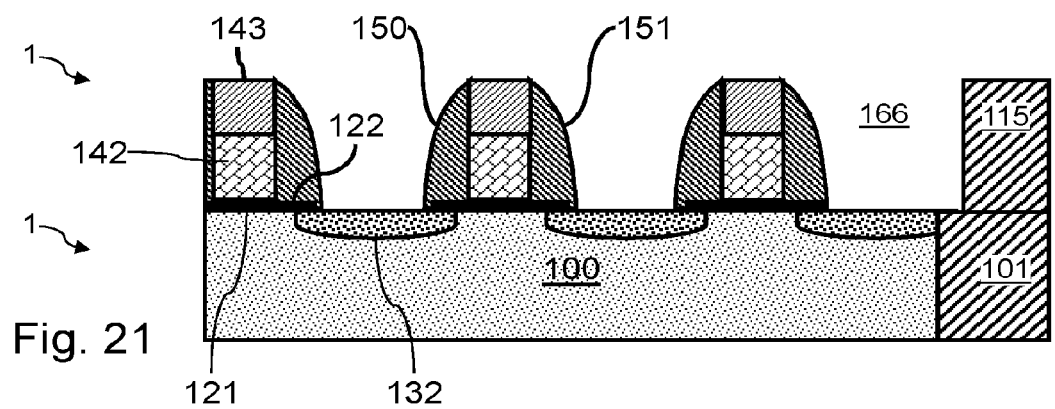

In FIG. 21, the formation of the spacers 150 and 151 is carried out on either side of each stacking of a gate electrode 142 and of a plug 143. The spacers 150 and 151 are made of a material of the Lk type, and can have the same composition as in the preceding embodiment. The spacers 150 and 151 here completely cover the upper face of the fillers 122 and block the accesses 167 in order to provide an optimum protection of the fillers 122 with respect to a source or drain contact.

In order to obtain the integrated circuit illustrated in FIG. 14, a metallization has been carried out in order to fill the accesses 166, until in contact with the regions 132. A step for chemical-mechanical polishing of the metal deposition has subsequently been carried out with a stop on the plugs 143.

Contacts 180 have thus been formed on the regions 132. The contacts 180 are thus electrically connected to the sources and drains of the transistors 171 to 173. These contacts 180 are self-aligned with the gate stacks of the various transistors 171 to 173, since they extend as far as being aligned with the spacers 150 and 151. These contacts 180 may be formed from the same material as in the preceding embodiment.

It may be envisaged to carry out prior steps for silicidation of the regions 132, or for deposition of a thin layer of dielectric on these regions 132, in order to reduce the contact resistance with the source or drain contacts 180.

The invention is also applicable to an integrated circuit 1 comprising transistors of the FIN-FET type.

Although the invention proves to be particularly suited to reducing the stray capacitances for transistors comprising self-aligned source or drain contacts, the invention allows also the stray capacitances to be reduced when these contacts are laterally shifted with respect to the spacers of the transistors.

The invention claimed is:

1. A method for fabrication of a field-effect transistor starting from a substrate comprising a layer of semiconductor material covered by a sacrificial gate, the sacrificial gate comprising a sacrificial gate insulator comprising:
    a middle part covered by a sacrificial gate material, and
    edges covered by sacrificial spacers, the said edges having a thickness tox;
    the method comprising the steps for:
    removing the sacrificial gate material and the sacrificial gate insulator so as to create a groove between and under the sacrificial spacers;
    forming a conformal deposition of thickness thk of dielectric material inside of the groove on the internal faces of the sacrificial spacers and on the layer of semiconductor material and under the sacrificial spacers in order to form a gate insulator layer, the said dielectric material having a dielectric constant equal to at least 4, and $tox > thk \geq tox/2$;

forming a gate electrode on the gate insulator layer within the groove;
    removing the sacrificial spacers and the deposition of dielectric material formed on the internal faces of the sacrificial spacers, in such a manner as to open up edges of the gate insulator layer;
    forming spacers on the edges of the gate insulator layer on either side of the gate electrode, these spacers having a dielectric constant at the most equal to 3.5.

2. The method for fabrication of a field-effect transistor according to claim 1, in which $Rk = Ehk/Elk \geq 2$, with Ehk the dielectric constant of the dielectric material deposited for forming the gate insulator layer and Elk the dielectric constant of the spacers formed on the edges of the gate insulator layer.

3. The method for fabrication of a field-effect transistor according to claim 1, in which tox is in the range between 2 and 5 nm.

4. The method for fabrication of a field-effect transistor according to claim 1, wherein said deposited dielectric material is selected from within the group composed of $TiO_2$, $Al_2O_3$, $ZrO_2$, $HfO_2$, HfSiO, $Ta_2O_5$, $La_2O_3$, and of nitrides of these materials.

5. The method for fabrication of a field-effect transistor according to claim 1, further comprising a step for formation of source and drain contacts on either side of the gate electrode, the said contacts extending to be in line with the said spacers formed on the edges of the gate insulator layer.

6. The method for fabrication of a field-effect transistor according to claim 1, wherein said spacers formed cover the edges of the gate insulator layer.

7. The method for fabrication of a field-effect transistor according to claim 1, wherein said substrate supplied comprises:
    a layer of buried insulator under the layer of semiconductor material; and
    raised elements made of a semiconductor material disposed on either side of the sacrificial gate.

8. The method for fabrication of a field-effect transistor according to claim 7, in which the wherein said spacers formed on the edges of the gate insulator layer comprise extensions over one edge of the said raised elements.

9. The method for fabrication of a field-effect transistor according to claim 8, wherein said extensions extend over a length in the range between 3 and 5 nm over the edge of the said raised elements.

10. The method for fabrication of a field-effect transistor according to claim 7, comprising a prior step for deposition of the raised elements by epitaxy on either side of the sacrificial gate insulator.

11. The method for fabrication of a field-effect transistor according to claim 1, wherein said substrate supplied is of the bulk substrate type and comprises a doped source and drain arranged on either side of the sacrificial gate.

12. The method for fabrication of a field-effect transistor according to claim 1, wherein said dielectric material deposited inside of the groove is different from the material of the sacrificial spacers.

13. The method for fabrication of a field-effect transistor according to claim 1, further comprising the formation of a plug made of a dielectric material on said gate electrode formed.

14. The method for fabrication of a field-effect transistor according to claim 1, wherein the sacrificial gate insulator is an oxide.

* * * * *